(12) United States Patent
Bae

(10) Patent No.: US 11,127,454 B2
(45) Date of Patent: Sep. 21, 2021

(54) SEMICONDUCTOR MEMORY DEVICE AND OPERATING METHOD THEREOF

(71) Applicant: Samsung Electronics Co., Ltd., Suwon-si (KR)

(72) Inventor: Whiyoung Bae, Gwangju-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/811,331

(22) Filed: Mar. 6, 2020

(65) Prior Publication Data
US 2021/0005243 A1      Jan. 7, 2021

(30) Foreign Application Priority Data

Jul. 5, 2019   (KR) .................. 10-2019-0081179

(51) Int. Cl.
*G11C 7/00* (2006.01)
*G11C 11/4094* (2006.01)
*G11C 11/4096* (2006.01)
*G11C 11/4091* (2006.01)

(52) U.S. Cl.
CPC ...... *G11C 11/4094* (2013.01); *G11C 11/4091* (2013.01); *G11C 11/4096* (2013.01)

(58) Field of Classification Search
CPC ....... G11C 11/4091; G11C 7/065; G11C 7/06; G11C 11/4097

USPC ......................... 365/206, 207, 208
See application file for complete search history.

(56) References Cited

U.S. PATENT DOCUMENTS

| | | | |
|---|---|---|---|
| 6,067,264 A | 5/2000 | Kwon | |
| 8,842,483 B2 * | 9/2014 | Pyo | G11C 5/147 |
| | | | 365/189.07 |
| 2003/0021174 A1 | 1/2003 | Lee et al. | |
| 2005/0232032 A1 | 10/2005 | Lee | |
| 2008/0002498 A1 | 1/2008 | Cho | |
| 2010/0214856 A1 | 8/2010 | Shiah | |
| 2012/0230139 A1 | 9/2012 | Son et al. | |
| 2013/0265839 A1 | 10/2013 | Choi | |
| 2013/0343140 A1 | 12/2013 | Sabbah | |

* cited by examiner

*Primary Examiner* — Son T Dinh
(74) *Attorney, Agent, or Firm* — Muir Patent Law, PLLC

(57) ABSTRACT

A semiconductor memory device includes a plurality of memory cells connected a pair of bit lines, a column selection circuit, and a sense amplifier. When the semiconductor memory device is in a data writing operation, the column selection circuit electrically connects a pair of data input and output lines to the pair of bit lines during a first time interval and a second time interval, consecutively arranged, and the sense amplifier electrically disconnects from the pair of bit lines during the first time interval, and senses and amplifies a voltage difference between the pair of bit lines during the second time interval.

20 Claims, 9 Drawing Sheets

SEMICONDUCTOR MEMORY DEVICE AND OPERATING METHOD THEREOF

CROSS-REFERENCE TO RELATED APPLICATION(S)

This application claims benefit of priority to Korean Patent Application No. 10-2019-0081179 filed on Jul. 5, 2019 in the Korean Intellectual Property Office, the disclosure of which is incorporated herein by reference in its entirety.

BACKGROUND

Example embodiments of the present invention relate to a semiconductor memory device and an operating method thereof.

Among semiconductor memory devices, a dynamic random access memory (DRAM) may write data by storing an electric charge in a cell capacitor of a memory cell, and may read out data by sensing and amplifying a voltage difference between a pair of bit lines caused by an electric charge accumulated in the cell capacitor. To write data, a data input and output line may be connected to a writing driver. Also, there have been continuous attempts to improve an operational speed of a semiconductor memory device.

SUMMARY

An example embodiment of the present inventive concept is to provide a semiconductor memory device having an improved operational speed.

Another example embodiment of the present inventive concept is to provide a data writing method of a semiconductor memory device, which may improve an operational speed.

According to an example embodiment of the present inventive concept, a semiconductor memory device is provided, the semiconductor memory device including a plurality of memory cells connected to a pair of bit lines, a column selection, and a sense amplifier. When the semiconductor memory device is in a data writing operation, the column selection circuit electrically connects a pair of data input and output lines to the pair of bit lines during a first time interval and a second time interval, consecutively arranged, and the sense amplifier electrically disconnects from the pair of bit lines during the first time interval, and senses and amplifies a voltage difference between the pair of bit lines during the second time interval.

According to an example embodiment of the present inventive concept, a semiconductor memory device is provided, the semiconductor memory device including a first memory cell connected to a bit line; a second memory cell connected to a complementary bit line, a first isolation transistor connected between the bit line and a sensing bit line, and having a gate configured to receive an isolation signal, a second isolation transistor connected between the complementary bit line and a complementary sensing bit line, and having a gate configured to receive the isolation signal, a first column selection transistor connected between the bit line and a data input and output signal line, and having a gate configured to receive a column selection signal, a second column selection transistor connected between the complementary bit line and a complementary data input and output signal line, and having a gate configured to receive the column selection signal, and a sense amplifier connected between the sensing bit line and the complementary sensing bit line. When the semiconductor memory device is in a data writing operation, the first column selection transistor and the second column selection transistor are turned on during a first time interval and a second time interval, consecutively arranged, the first isolation transistor and the second isolation transistor are turned off during the first time interval and are turned on during the second time interval, and the sense amplifier senses and amplifies a voltage difference between the sensing bit line and the complementary sensing bit line during the first time interval and the second time interval.

According to an example embodiment of the present inventive concept, an operating method of a semiconductor memory device, including a sense amplifier sensing and amplifying a voltage difference between a pair of bit lines, is provided. The method includes performing a first write driving operation and performing a second write driving operation after performing the first write driving operation. The first write driving operation includes electrically connecting a pair of data input and output lines to a pair of bit lines, transmitting data to the pair of bit lines from the pair of data input and output lines, and electrically disconnecting the pair of bit lines from the sense amplifier, and the second write driving operation includes electrically connecting the pair of bit lines to the sense amplifier, and by the sense amplifier, sensing and amplifying a voltage difference between the pair of bit lines.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, several example embodiments of the invention will be described as follows with reference to the accompanying drawings.

Figure 1:
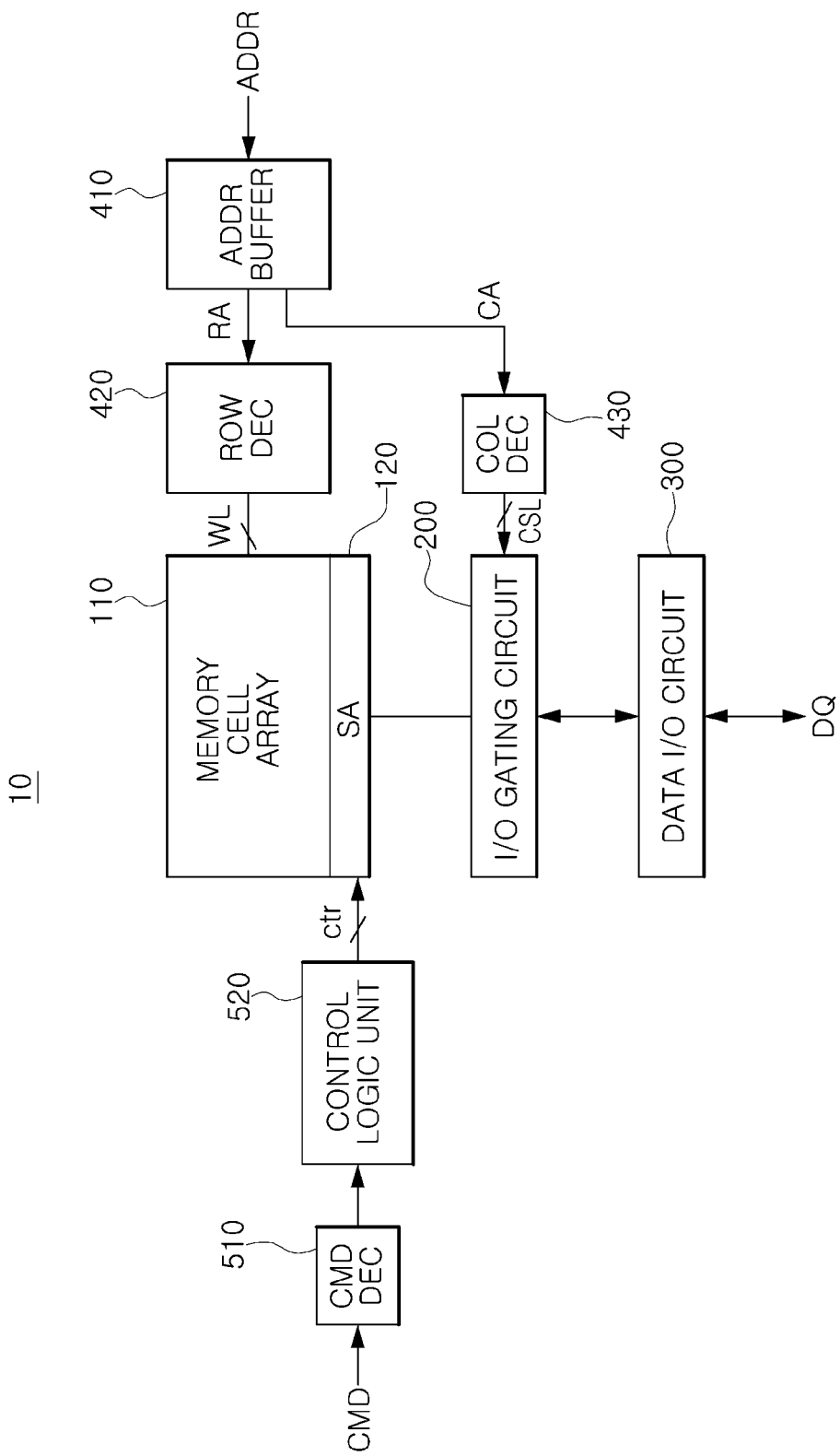
FIG. 1 is a block diagram illustrating a semiconductor memory device according to an example embodiment of the present inventive concept.

FIG. 1 is a block diagram illustrating a semiconductor memory device according to an example embodiment. A semiconductor memory device 10 may include a memory cell array 110, a sense amplifier block 120, an input and output gating circuit 200, a data input and output circuit 300, an address buffer 410, a row decoder 420, a column decoder 430, a command decoder 510, and a control logic 520.

The semiconductor memory device 10 may be a storage device based on a semiconductor device. For example, the semiconductor memory device 10 may be implemented as a volatile memory such as a DRAM, a synchronous DRAM (SDRAM), a double data rate SDRAM (DDR SDRAM), a low power double data rate SDRAM (LPDDR SDRAM), a graphics double data rate SDRAM (GDDR SDRAM), a DDR2 SDRAM, a DDR3 SDRAM, a DDR4 SDRAM, a Thyristor RAM (TRAM), and the like, or a non-volatile memory such as a phase change random access memory (PRAM), a magnetic random access memory (MRAM), a resistive random access memory (RRAM), and the like.

The semiconductor memory device 10 may receive signals including a command CMD and an address ADDR from an external device (e.g., a central processing unit (CPU) or a memory controller), and may input or output data through data pads DQ. In example embodiments, the command CMD and the address ADDR may be provided to the semiconductor memory device 10 through a command address bus. In the command address bus, the command CMD or the address ADDR may be disposed in time series.

The memory cell array 110 may include a plurality of memory cells arranged in matrix form. The memory cell array 110 may include a plurality of word lines connected to the memory cells, a plurality of bit lines, and a plurality of complementary bit lines. The plurality of memory cells may be connected to corresponding word lines of the plurality of word lines and may be connected between corresponding bit lines or corresponding complementary bit lines of the plurality of bit lines and the plurality of complementary bit lines, respectively.

The sense amplifier block 120 may be connected to the plurality of bit lines and the plurality of complementary bit lines of the memory cell array 110, and may sense and amplify a voltage difference between a pair of bit lines (a bit line and a complementary bit line corresponding to each other).

The input and output gating circuit 200 may include read data latches storing data of a pair of bit lines selected by a column selection signal, and a writing driver for writing data in the memory cell array 110.

The data input and output circuit 300 may provide data stored in the read data latches to the data pads DQ, or may provide write data received through the data pads DQ to the writing driver of the input and output gating circuit 200.

The address buffer 410 may receive an address ADDR from an external device (e.g., a central processing unit (CPU) or a memory controller). The address ADDR may include a row address RA addressing a row of the memory cell array 110 and a column address CA addressing a column of the memory cell array 110. The address buffer 410 may transmit the row address RA to the row decoder 420, and may transmit the column address CA to the column decoder 430.

The row decoder 420 may select one of a plurality of word lines WL of the memory cell array 110 in response to a row address RA. In other words, the row decoder 420 may decode the row address RA received from the address buffer 410, may select one of the word lines corresponding to the row address RA, and may activate the selected word line.

The column decoder 430 may select portions of bit lines and portions of complementary bit lines of the plurality of bit lines and the plurality of complementary bit lines of the memory cell array 110 in response to the column address CA. As disclosed herein, "a portion" or "portions" may be "a circuit" or "circuits." The column decoder 430 may decode the column address CA received from the address buffer 410 and may generate a column selection signal CSL, and the column decoder 430 may select a bit line and a complementary bit line by the column selection signal CSL through the input and output gating circuit 200.

The command decoder 510 may decode a command CMD (e.g., a row address strobe signal (/RAS), a column address strobe signal (/CAS), a chip selection signal (/CS), a write enable signal (/WE), and the like) received from an external device (e.g., a central processing unit (CPU) or a memory controller). The command CMD may include an active command ACT, a read command RD, a write command WR, a pre-charge command PRE, and the like.

The control logic 520 may generate control signals ctr in response to the decoded command CMD. The control logic 520 may be implemented, for example, as a circuit. The control signals ctr may include an isolation signal ISO, an offset control signal OC, a sensing driving control signal, and the like.

Figure 2:
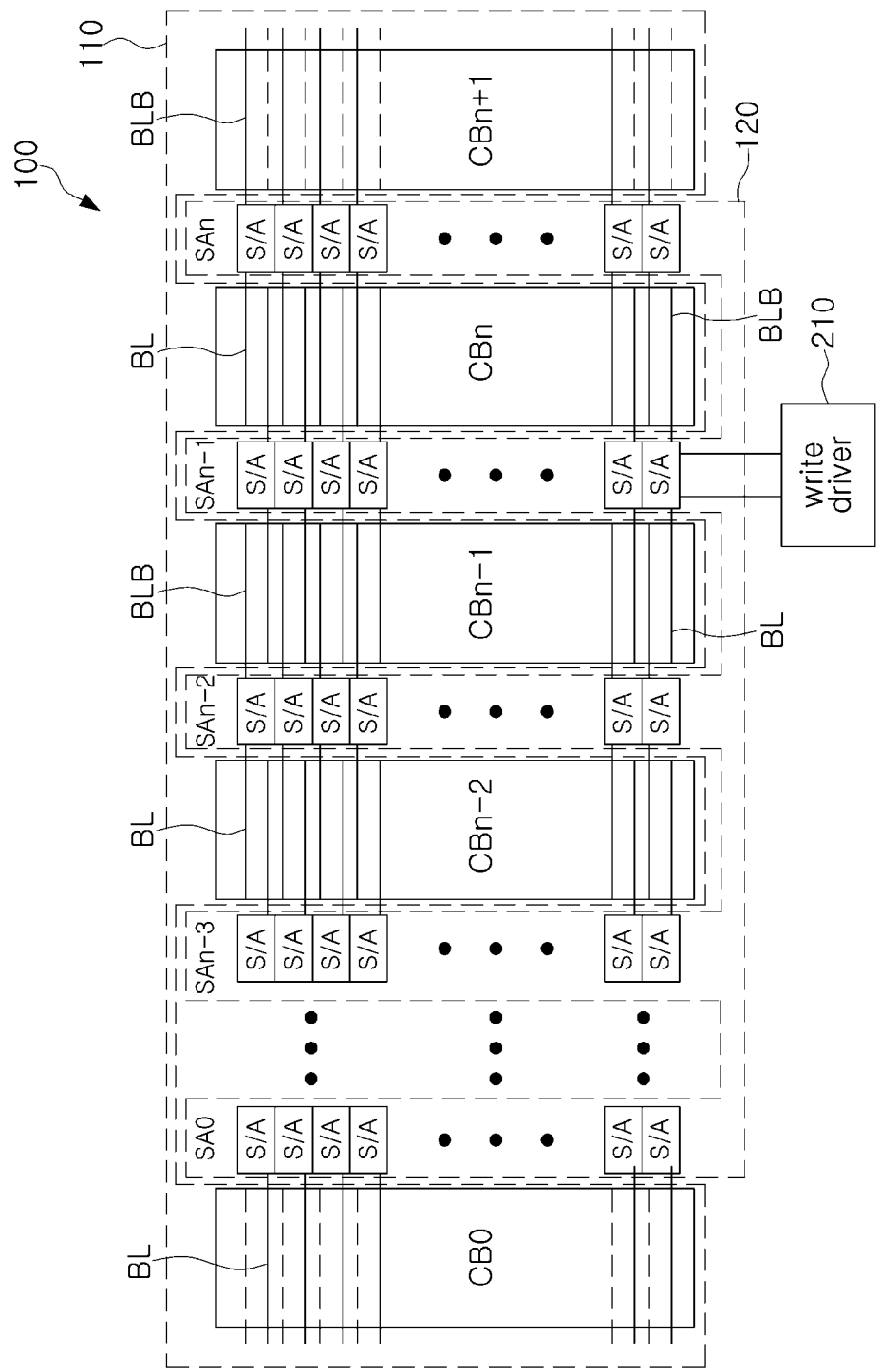
FIG. 2 is a block diagram illustrating a memory cell array and a sense amplifier block of a semiconductor memory device according to an example embodiment of the present inventive concept.

FIG. 2 is a block diagram illustrating a portion 100 of a semiconductor memory device 10 including a memory cell array 110 and a sense amplifier block 120.

The memory cell array 110 may include a plurality of memory cell blocks CB0 to CBn+1 (n may be a natural number, including 0). The sense amplifier block 120 may include a plurality of bit line sense amplifier blocks SA0 to SAn. The plurality of bit line sense amplifier blocks SA0 to SAn may be disposed between the plurality of memory cell blocks CB0 to CBn+1. For example, a memory cell block CBn−1 and a memory cell block CBn may be disposed on both ends of a bit line sense amplifier block SAn−1. In other words, the memory cell block CBn−1 and the memory cell block CBn may be disposed on both sides of the bit line sense amplifier block SAn−1. In some examples, the bit line sense amplifier block SAn−1 is disposed between the memory cell block CBn−1 and the memory cell block CBn.

Each of the plurality of bit line sense amplifier blocks SA0 to SAn may include a plurality of bit line sense amplifiers S/A each S/A connected to a bit line BL and a complementary bit line BLB. Hereinafter, it will be understood that when an element is referred to as being "connected" to another element, it may be "electrically connected" and also be "physically connected" to the other element. In contrast, when an element is referred to as being "disconnected" to another element, it may be "electrically disconnected" and also be "physically disconnected" to the other element." The bit line sense amplifier S/A may be repeatedly disposed in a direction in which the bit line BL and the complementary bit line BLB extend. The bit line BL and the complementary bit line BLB may be included in a pair of bit lines, and may be connected to the bit line sense amplifiers S/A in a data read operation or a data writing operation. Each bit line sense amplifier S/A may be disposed in two bit line pitches (e.g., a distance between a bit line BL and a complementary bit line BLB).

A writing driver 210 may be included in the input and output gating circuit 200 illustrated in FIG. 1, and may drive a data input and output line in accordance with data to be stored in a cell capacitor of a memory cell in a data writing operation.

Figure 3:
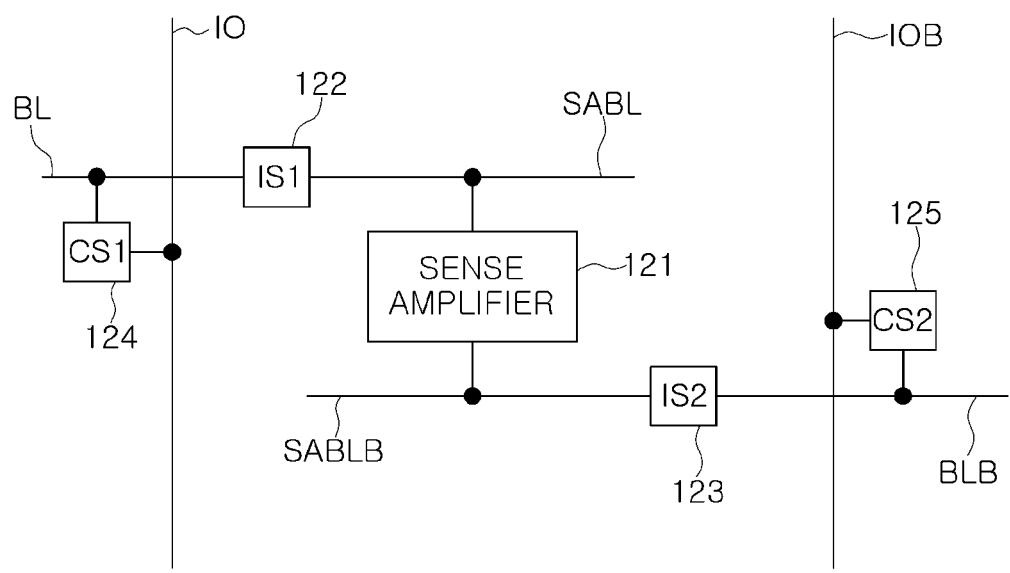
FIG. 3 is a diagram illustrating an operation of a semiconductor memory device according to an example embodiment of the present inventive concept.

FIG. 3 is a diagram illustrating an operation of a semiconductor memory device according to an example embodiment. In example embodiments, a bit line sense amplifier of the semiconductor memory device may include a sense amplifier 121, a first isolation portion 122, a second isolation portion 123, a first column selection portion 124, and a second column selection portion 125. In FIG. 3, the term "BL" indicates a bit line, "BLB" indicates a complementary bit line, "SABL" indicates a sensing bit line, "SABLB" indicates a complementary sensing bit line, "IO" indicates a data input and output line, and "JOB" indicates a complementary data input and output line.

The sense amplifier 121 may be connected to a pair of sensing bit lines (a sensing bit line SABL and a complementary sensing bit line SABLB), and may sense and amplify a signal (e.g., a difference in voltage between the sensing bit line SABL and the complementary sensing bit line SABLB) of the pair of sensing bit lines using a sensing driving voltage supplied in response to a sensing driving control signal.

The first isolation portion 122 and the second isolation portion 123 may connect a pair of bit lines (a bit line BL and a complementary bit line BLB) to the sense amplifier 121 or may disconnect the pair of bit lines from the sense amplifier 121 in response to an isolation signal ISO. The first isolation portion 122 may connect the bit line BL to the sensing bit line SABL or may disconnect the bit line BL from the sensing bit line SABL in response to the isolation signal ISO. The second isolation portion 123 may connect the complementary bit line BLB to the complementary sensing bit line SABLB or may disconnect the complementary bit line BLB from the complementary sensing bit line SABLB in response to the isolation signal ISO.

The first column selection portion 124 may connect a data input and output line IO to the bit line BL or may disconnect the data input and output line IO from the bit line BL in response to a column selection signal CSL. The second column selection portion 125 may connect a complementary data input and output line IOB to a complementary bit line BLB or may disconnect the complementary data input and output line IOB form the complementary bit line BLB in response to the column selection signal CSL.

In a data writing operation, the bit line BL may be connected to the sensing bit line SABL, the complementary bit line BLB may be connected to the complementary sensing bit line SABLB, and a sensing driving voltage may be supplied to the sense amplifier 121. The above-described operation may be performed in response to an active command ACT. For example, an isolation signal ISO may be activated in response to the active command ACT, the first isolation portion 122 and the second isolation portion 123 may connect the bit line BL to the sensing bit line SABL in response to the activated isolation signal ISO, and may connect the complementary bit line BLB to the complementary sensing bit line SABLB, thereby connecting the sense amplifier 121 to the bit line BL and the complementary bit line BLB. Also, a sensing driving control signal may be activated in response to the active command ACT, and a sensing driving voltage may be supplied to the sense amplifier 121 in response to the activated sensing driving control signal. The sense amplifier 121 may sense and amplify a voltage difference between the sensing bit line SABL and the complementary sensing bit line SABLB using the sensing driving voltage, thereby sensing and amplifying a voltage difference between the bit line BL and the complementary bit line BLB.

The data input and output line IO may be connected to the bit line BL, and a complementary data input and output line IOB may be connected to the complementary bit line BLB. In this operation, the sense amplifier 121 may be temporally disconnected from the bit line BL and the complementary bit line BLB and may be connected to the bit line BL and the complementary bit line BLB again. Accordingly, writing data may be transferred to a pair of bit lines (the bit line BL and the complementary bit line BLB) through a pair of data input and output lines (the data input and output line IO and the complementary data input and output line IOB), may be amplified by the sense amplifier 121, and may be stored in a cell capacitor of a memory cell. The above-described operation may be performed in response to a writing command WR. For example, a column selection signal CSL may be activated in response to the writing command WR, the first column selection portion 124 and the second column selection portion 125 may connect the data input and output line IO to the bit line BL in response to the activated column selection signal CSL, and may connect the complementary data input and output line IOB to the complementary bit line BLB. Also, the isolation signal ISO may be temporally inactivated in response to the writing command WR and may be activated. The first isolation portion 122 and the second isolation portion 123 may temporally disconnect the bit line BL from the sensing bit line SABL and may connect the bit line BL to the sensing bit line SABL again and may temporally disconnect the complementary bit line BLB from the complementary sensing bit line SABLB and may connect the complementary bit line BLB to the complementary sensing bit line SABLB again, in response to the isolation signal ISO, thereby temporally disconnecting the sense amplifier 121 from the bit line BL and the complementary bit line BLB and connecting the sense amplifier 121 to the bit line BL and the complementary bit line BLB again.

Figure 4:
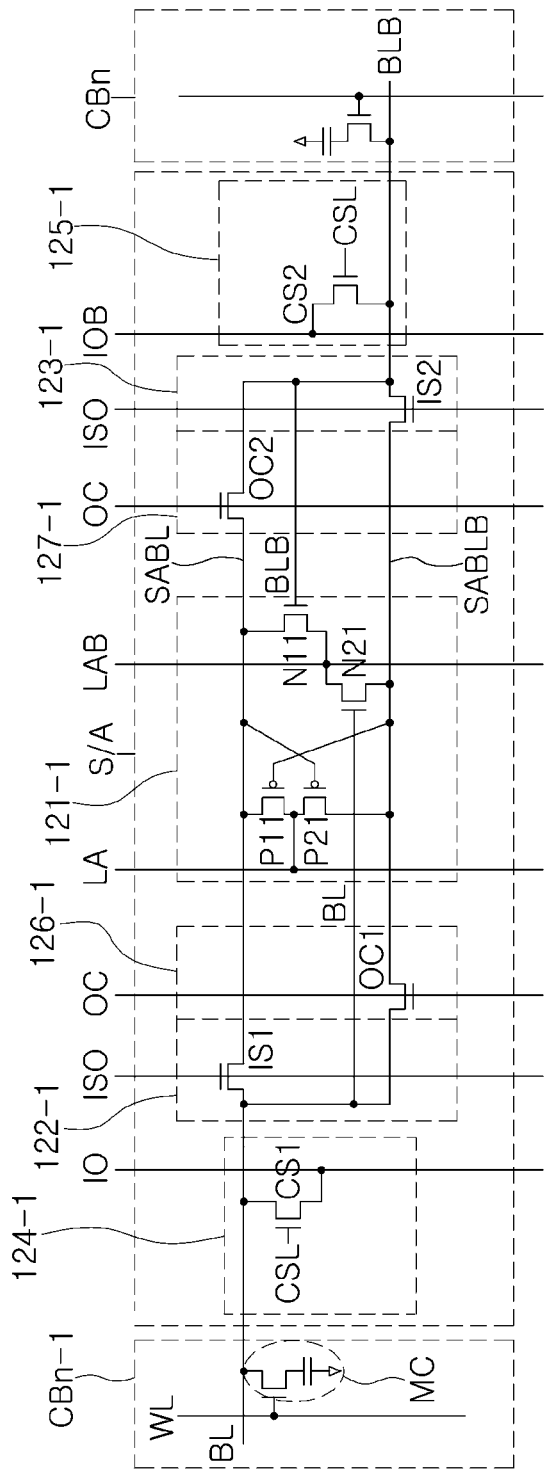
FIG. 4 is a diagram illustrating portions of circuits of a semiconductor memory device which include a bit line sense amplifier according to an example embodiment of the present inventive concept.

FIG. 4 is a diagram illustrating portions of circuits of a semiconductor memory device which include a bit line sense amplifier according to an example embodiment. A first bit line sense amplifier S/A-1 may include a sense amplifier 121-1, a first isolation portion 122-1, a second isolation portion 123-1, a first column selection portion 124-1, a second column selection portion 125-1, a first offset removing portion 126-1, and a second offset removing portion 127-1. In some examples, the semiconductor memory device may include a pre-charging portion (not shown).

The sense amplifier 121-1 may be connected between a sensing bit line SABL and a complementary sensing bit line SABLB, and may sense and amplify a voltage difference between the sensing bit line SABL and the complementary sensing bit line SABLB using a first sensing driving voltage LA and a second sensing driving voltage LAB. As the sensing bit line SABL and the complementary sensing bit line SABLB are connected to a bit line BL and a complementary bit line BLB, respectively, the sense amplifier 121-1 may sense and amplify a voltage difference between the bit line BL and the complementary bit line BLB. The sense amplifier 121-1 may include a first PMOS transistor P11, a second PMOS transistor P21, a first NMOS transistor N11, and a second NMOS transistor N21.

The first PMOS transistor P11 may include a first end connected to the sensing bit line SABL, a second end connected to the first sensing driving voltage LA, and a gate connected to the complementary sensing bit line SABLB. The second PMOS transistor P21 may include a first end connected to the complementary sensing bit line SABLB, a second end connected to the first sensing driving voltage LA, and a gate connected to the sensing bit line SABL. The first sensing driving voltage line LA may be a first internal voltage VINTA supplied to be used in an operation of the memory cell array 110 (in FIG. 1). The first internal voltage VINTA may be a voltage generated in a voltage generator of the semiconductor memory device 100. The voltage generator may receive a power voltage VDD applied from an external entity, present externally of the semiconductor memory device 100, and may generate a first internal voltage VINTA having a voltage level lower than a level of the power voltage VDD.

The first NMOS transistor N11 may include a first end connected to the sensing bit line SABL, a second end connected to the second sensing driving voltage LAB, and a gate connected to the complementary bit line BLB. The second NMOS transistor N21 may include a first end connected to the complementary sensing bit line SABLB, a second end connected to the second sensing driving voltage LAB, and a gate connected to the bit line BL. The second sensing driving voltage LAB may be a second internal voltage VSS of the semiconductor memory device 100. The second internal voltage VSS may be a ground voltage or a negative (−) voltage.

The first isolation portion 122-1 may be connected to the bit line BL and the sensing bit line SABL, and may connect the bit line BL to the sensing bit line SABL or may disconnect the bit line BL from the sensing bit line SABL in response to an isolation signal. The first isolation portion 122-1 may include a first isolation transistor IS1.

The first isolation transistor IS1 may include a first end connected to the bit line BL, a second end connected to the sensing bit line SABL, and a gate receiving an isolation signal ISO.

The second isolation portion 123-1 may be connected between the complementary bit line BLB and the complementary sensing bit line SABLB, and may connect the complementary bit line BLB to the complementary sensing bit line SABLB or may disconnect the complementary bit line BLB from the complementary sensing bit line SABLB in response to an isolation signal. The second isolation portion 123-1 may include a second isolation transistor IS2.

The second isolation transistor IS2 may include a first end connected to the complementary bit line BLB, a second end connected to the complementary sensing bit line SABLB, and a gate receiving the isolation signal ISO.

The first column selection portion 124-1 may be connected between a data input and output line IO and the bit line BL, and may connect the data input and output line IO to the bit line BL or may disconnect the data input and output line IO from the bit line BL in response to a column selection signal CSL. The first column selection portion 124-1 may include a first column selection transistor CS1.

The first column selection transistor CS1 may include a first end connected to the data input and output line IO, a second end connected to the bit line BL, and a gate receiving the column selection signal CSL.

The second column selection portion 125-1 may be connected between the complementary data input and output line IOB and the complementary bit line BLB, and may connect the complementary data input and output line IOB to the complementary bit line BLB or may disconnect the complementary data input and output line IOB from the complementary bit line BLB in response to the column selection signal CSL. The second column selection portion 125-1 may include a second column selection transistor CS2.

The second column selection transistor CS2 may include a first end connected to the complementary data input and output line IOB, a second end connected to the complementary bit line BLB, and a gate receiving the column selection signal CSL.

In example embodiments, the first column selection portion 124-1 and the second column selection portion 125-1 may be included in the input and output gating circuit 200 (in FIG. 1).

The first offset removing portion 126-1 may be connected between the bit line BL and the complementary sensing bit line SABLB, and may connect the bit line BL to the complementary sensing bit line SABLB or may disconnect the bit line BL from the complementary sensing bit line SABLB in response to an offset control signal. The first offset removing portion 126-1 may include a first offset removing transistor OC1.

The first offset removing transistor OC1 may include a first end connected to the bit line BL, a second end connected to the complementary sensing bit line SABLB, and a gate receiving an offset control signal OC.

The second offset removing portion 127-1 may be connected between the complementary bit line BLB and the sensing bit line SABL, and may connect the complementary bit line BLB to the sensing bit line SABL or may disconnect the complementary bit line BLB from the sensing bit line SABL in response to an offset control signal. The second offset removing portion 127-1 may include a second offset removing transistor OC2.

The second offset removing transistor OC2 may include a first end connected to the complementary bit line BLB, a second end connected to the sensing bit line SABL, and a gate receiving the offset removing signal OC.

The pre-charging portion (not shown) may equalize voltage levels of the sensing bit line SABL and the complementary sensing bit line SABLB to a pre-charge voltage level by supplying a pre-charge voltage VBL (Herein, VBL may also be referred to as pre-charge voltage line). As the sensing bit line SABL and the complementary sensing bit line SABLB may be connected to the bit line BL and the complementary bit line BLB, respectively, the pre-charging portion may equalize voltage levels of the bit line BL and the complementary bit line BLB to the pre-charge voltage level. The pre-charge voltage level may be lower than the first internal voltage VINTA and higher than the ground voltage VSS.

Figure 5:
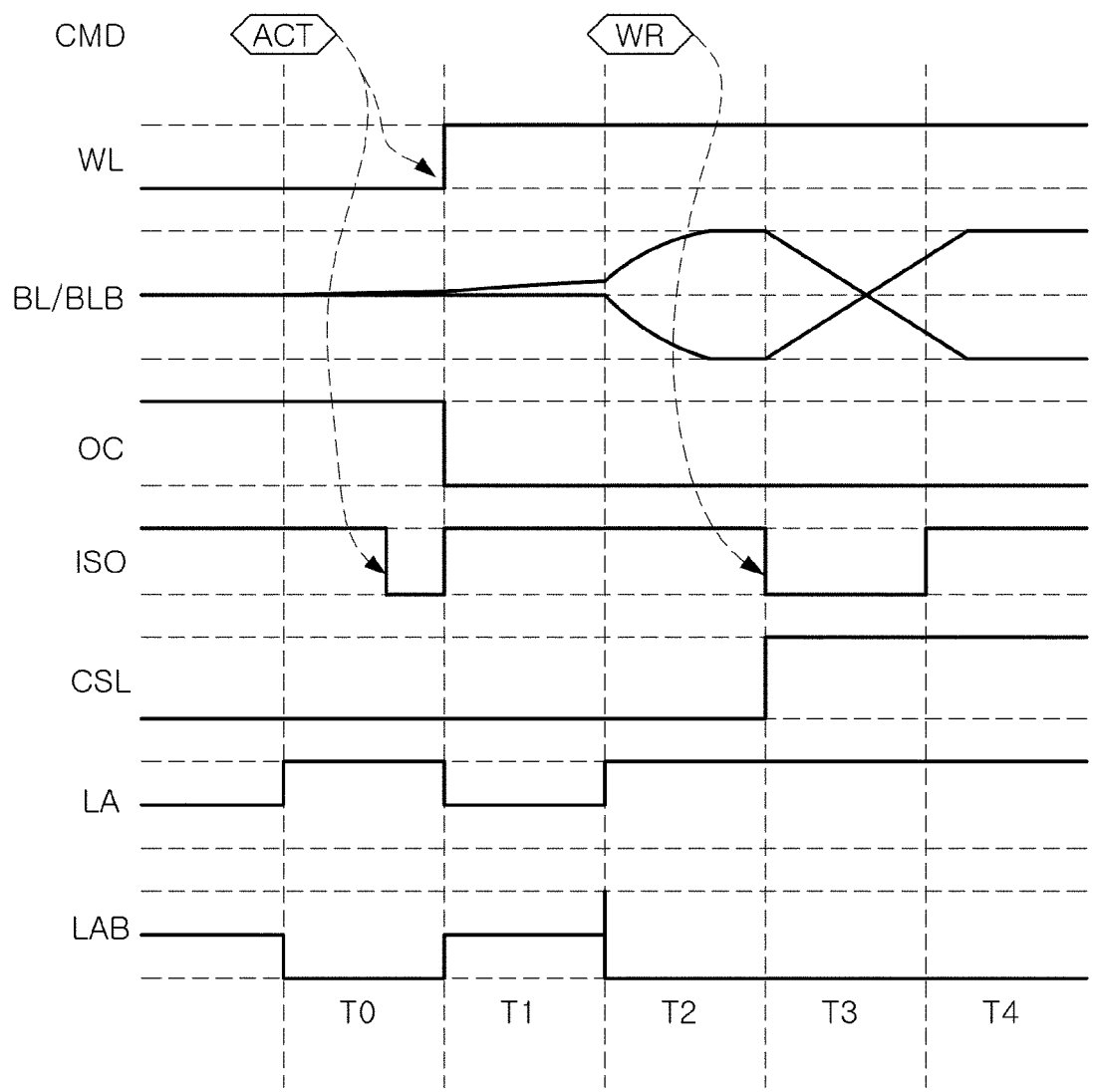
FIG. 5 is a diagram illustrating of operation timings of the semiconductor memory device illustrated in FIG. 4.

FIG. 5 is a diagram illustrating timings of a writing operation of the semiconductor memory device illustrated in FIG. 4, illustrating an example in which data different from data stored in a memory cell may be stored in the memory cell. Referring to FIG. 5, the semiconductor memory device in the example embodiment may perform an offset removing operation, a charge sharing operation, a sensing operation, first writing driving operation, and a second writing driving operation consecutively in sequence, thereby performing a data writing operation.

In a time interval prior to a time interval T0, the semiconductor memory device may be in a pre-charged state.

In the time interval T0, an offset removing operation may be performed.

In the time interval T0, a voltage of a selected word line WL may be a low level, a voltage of an offset control signal OC may be a high level, a voltage of an isolation signal ISO may be a low level, a voltage of a column selection signal CSL may be a low level, a first sensing driving voltage LA (Herein, LA may also be referred to as a first sensing driving voltage line) may be a first internal voltage VINTA, and a second sensing driving voltage LAB (Herein, LAB may also be referred to as a second sensing driving voltage line) may be a second internal voltage VSS lower than the first internal voltage VINTA. Accordingly, offset removing transistors OC1 and OC2 of a first offset removing portion 126-1 and a second offset removing portion 127-1 may be in an on-state, isolation transistors IS1 and IS2 of a first isolation portion 122-1 and a second isolation portion 123-1 may be in an off-state, and column selection transistors CS1 and CS2 of a first column selection portion 124-1 and a second column selection portion 125-1 may be in an off-state. The sense amplifier 121-1 may perform a sensing and amplifying operation in which a voltage difference between a sensing bit line SABL and a complementary sensing bit line SABLB is sensed and amplified. In this operation, as illustrated in FIG. 5, the isolation signal ISO may be a low level in a partial time interval of the time interval T0. The isolation signal ISO may also be transited to a low level in response to an active command ACT.

Due to a process variation or temperature, there may be a difference in threshold voltage among the transistors P11, P21, N11, and N21 of the sense amplifier 121-1, and the difference in threshold voltage may cause offset noise.

In the time interval T0, the bit line BL may be connected to the complementary sensing bit line SABLB, and the sense amplifier 121-1 may operate while the complementary bit line BLB is connected to the sensing bit line SABL. Accordingly, a voltage difference between the bit line BL and the complementary bit line BLB may be a value corresponding to an offset voltage according to offset noise of the transistors P11, P21, N11, and N21 of the sense amplifier 121-1. Thus, in the time interval T0, a difference corresponding to an offset voltage may be produced between the bit line BL and the complementary bit line BLB by performing the offset operation, thereby removing the above-described offset noise.

In a time interval T1, a charge sharing operation may be performed.

In the time interval T1, a voltage of a selected word line WL may be a high level, a voltage of the offset control signal OC may be a low level, a voltage of the isolation signal ISO may be a high level, a voltage of the column selection signal CSL may be a low level, and a first sensing driving voltage LA and a second sensing driving voltage LAB may be the pre-charge voltage level. The pre-charge voltage may be supplied to the first sensing driving voltage LA and second sensing driving voltage LAB by a pre-charge circuit (not shown). Accordingly, the offset removing transistors OC1 and OC2 of the first offset removing portion 126-1 and the second offset removing portion 127-1 may be in an off-state, the isolation transistors IS1 and IS2 of the first isolation portion 122-1 and the second isolation portion 123-1 may be in an on-state and the column selection transistors CS1 and CS2 of the first column selection portion 124-1 and the second column selection portion 125-1 may be in an off-state. A sensing operation of the sense amplifier 121-1 may be not performed in the time interval T1.

In the time interval T1, data (electric charge) stored in the memory cell may move to the bit line BL and the complementary bit line BLB and to the sensing bit line SABL and the complementary sensing bit line SABLB. Accordingly, charge sharing occurs between the memory cell and the bit line BL and the complementary bit line BLB, and between the memory cell and the sensing bit line SABL and the complementary sensing bit line SABLB.

In a time interval T2, a sensing operation may be performed.

In the time interval T2, a voltage of a selected word line WL may be a high level, a voltage of the offset control signal OC may be a low level, a voltage of the isolation signal ISO may be a high level, a voltage of the column selection signal CSL may be a low level, the first sensing driving voltage LA may be the first internal voltage VINTA, and the second sensing driving voltage LAB may be the second internal voltage VSS lower than the first internal voltage VINTA. Accordingly, the offset removing transistors OC1 and OC2 of the first offset removing portion 126-1 and the second offset removing portion 127-1 may be in an off-state, the isolation transistors IS1 and IS2 of the first isolation portion 122-1 and the second isolation portion 123-1 may be in an on-state, and the column selection transistors CS1 and CS2 of the first column selection portion 124-1 and the second column selection portion 125-1 may in an off-state. The sense amplifier 121-1 may perform a sensing and amplifying operation the time interval T2.

Accordingly, in the time interval T2, a voltage difference between the bit line BL and the complementary bit line BLB may be amplified in accordance with data stored in the memory cell.

In a time interval T3, a first writing driving operation may be performed.

In the time interval T3, a voltage of a selected word line WL may be a high level, a voltage of the offset control signal OC may be a low level, a voltage of the isolation signal ISO may be a low level, a voltage of the column selection signal CSL may be a high level, the first sensing driving voltage LA may be the first internal voltage VINTA, and the second sensing driving voltage LAB may be the second internal voltage VSS lower than the first internal voltage VINTA. The isolation signal ISO may be transited to a low level in response to a writing command WR. Accordingly, the offset removing transistors OC1 and OC2 of the first offset removing portion 126-1 and the second offset removing portion 127-1 may be in an off-state, the isolation transistors IS1 and IS2 of the first isolation portion 122-1 and the second isolation portion 123-1 may be in an off-state, and the column selection transistors CS1 and CS2 of the first column selection portion 124-1 and the second column selection portion 125-1 may in an on-state. The sense amplifier 121-1 may perform a sensing and amplifying operation in the time interval T3.

In the time interval T3, data transmitted to the data input and output line IO and the complementary data input and output line IOB through the writing driver 210 (in FIG. 2) may be transmitted to the bit line BL and the complementary bit line BLB via the column selection transistors CS1 and CS2 of the first column selection portion 124-1 and the second column selection portion 125-1. In this case, the bit line BL and the complementary bit line BLB may be disconnected from the sense amplifier 121-1 by being disconnected from the sensing bit line SABL and the complementary sensing bit line SABLB connected to the sense amplifier 121-1. For example, the isolation transistors IS1 and IS2 may be placed in an off-state by the isolation signal ISO transited to a low level in response to the writing command WR, and accordingly, the bit line BL and the complementary bit line BLB may be disconnected from the sensing bit line SABL and the complementary sensing bit line SABLB. Thus, even when data to be stored in the memory cell is different from data already stored in the memory cell, an operation of the writing driver 210 (in FIG. 2) may not contend with an operation of the sense amplifier 121-1, or a time during which the operations contend with each other may be reduced at least. Accordingly, states of the bit line BL and the complementary bit line BLB may be swiftly transited to difference states, and a speed of a writing operation may increase.

In a time interval T4, a second writing driving operation may be performed.

In the time interval T4, a voltage of a selected word line WL may be a high level, a voltage of the offset control signal OC may be a low level, a voltage of the isolation signal ISO may be a high level, a voltage of the column selection signal CSL may be a high level, the first sensing driving voltage LA may be the first internal voltage VINTA, and the second sensing driving voltage LAB may be the second internal voltage VSS lower than the first internal voltage VINTA. Accordingly, the offset removing transistors OC1 and OC2 of the first offset removing portion 126-1 and the second offset removing portion 127-1 may be in an off-state, the isolation transistors IS1 and IS2 of the first isolation portion 122-1 and the second isolation portion 123-1 may be in an on-state, and the column selection transistors CS1 and CS2 of the first column selection portion 124-1 and the second column selection portion 125-1 may in an on-state. The sense amplifier 121-1 may perform a sensing and amplifying operation.

In the time interval T4, a voltage difference between the bit line BL and the complementary bit line BLB may be sensed and amplified by operation of the sense amplifier 121-1. Also, data may be stored in the memory cell in accordance with a result of the operation of the sense amplifier 121-1.

Figure 6:
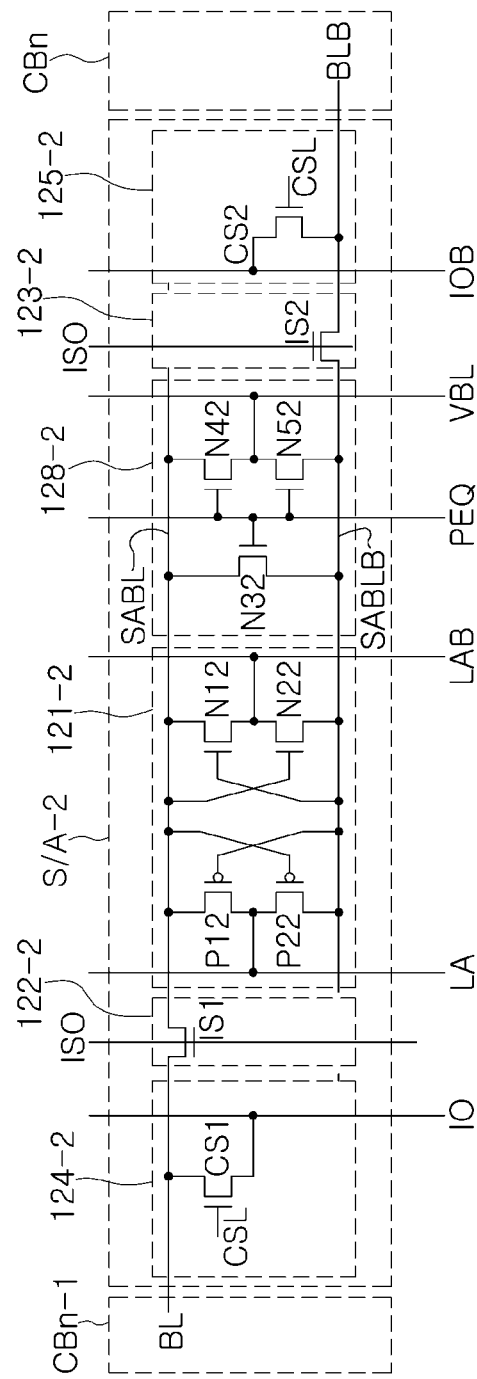
FIG. 6 is a diagram illustrating portions of circuits of a semiconductor memory device which include a bit line sense amplifier according to an example embodiment of the present inventive concept.

FIG. 6 is a diagram illustrating portions of circuits of a semiconductor memory device which include a bit line sense amplifier according to an example embodiment. A second bit line sense amplifier S/A-2 may include a sense amplifier 121-2, a first isolation portion 122-2, a second isolation portion 123-2, a first column selection portion 124-2, a second column selection portion 125-2, and a pre-charging portion 128-2.

A function of the sense amplifier 121-2 may be the same as the function of the sense amplifier 121-1 described with reference to FIG. 4 in the aforementioned example embodiment. The sense amplifier 121-2 may include a first PMOS transistor P12, a second PMOS transistor P22, a first NMOS transistor N12, and a second NMOS transistor N22.

The first PMOS transistor P12 may include a first end connected to a sensing bit line SABL, a second end connected to a first sensing driving voltage line LA, and a gate connected to a complementary sensing bit line SABLB. The second PMOS transistor P22 may include a first end connected to the complementary sensing bit line SABLB, a second end connected to the first sensing driving voltage line LA, and a gate connected to the sensing bit line SABL.

The first NMOS transistor N12 may include a first end connected to the sensing bit line SABL, a second end connected to a second sensing driving voltage line LAB, and a gate connected to the complementary sensing bit line SABLB.

Functions and configurations of the first isolation portion 122-2, the second isolation portion 123-2, the first column selection portion 124-2, and the second column selection portion 125-2 may be the same as those of the first isolation portion 122-1, the second isolation portion 123-1, the first column selection portion 124-1, and the second column selection portion 125-1 described with reference to FIG. 4 in the aforementioned example embodiment, respectively.

The pre-charging portion 128-2 may equalize voltage levels of the sensing bit line SABL and the complementary sensing bit line SABLB to a pre-charge voltage level. The pre-charging portion 128-2 may include a third NMOS transistor N32 connected between the sensing bit line SABL and the complementary sensing bit line SABLB, a fourth NMOS transistor N42 connected between a pre-charge voltage line VBL and the sensing bit line SABL, and a fifth NMOS transistor N52 connected between the pre-charge voltage line VBL and the complementary sensing bit line SABLB. A gate of the third NMOS transistor N32, a gate of the fourth NMOS transistor N42, and a gate of the fifth NMOS transistor N52 may be connected to an equalizing signal line PEQ. As the sensing bit line SABL and the complementary sensing bit line SABLB may be connected to the bit line BL and the complementary bit line BLB, respectively, the pre-charging portion 128-2 may equalize voltage levels of the bit line BL and the complementary bit line BLB to a pre-charge voltage level. In example embodiments, the pre-charging portion 128-2 may not include at least one of the third NMOS transistor N32, the fourth NMOS transistor N42, and the fifth NMOS transistor N52.

Figure 7:
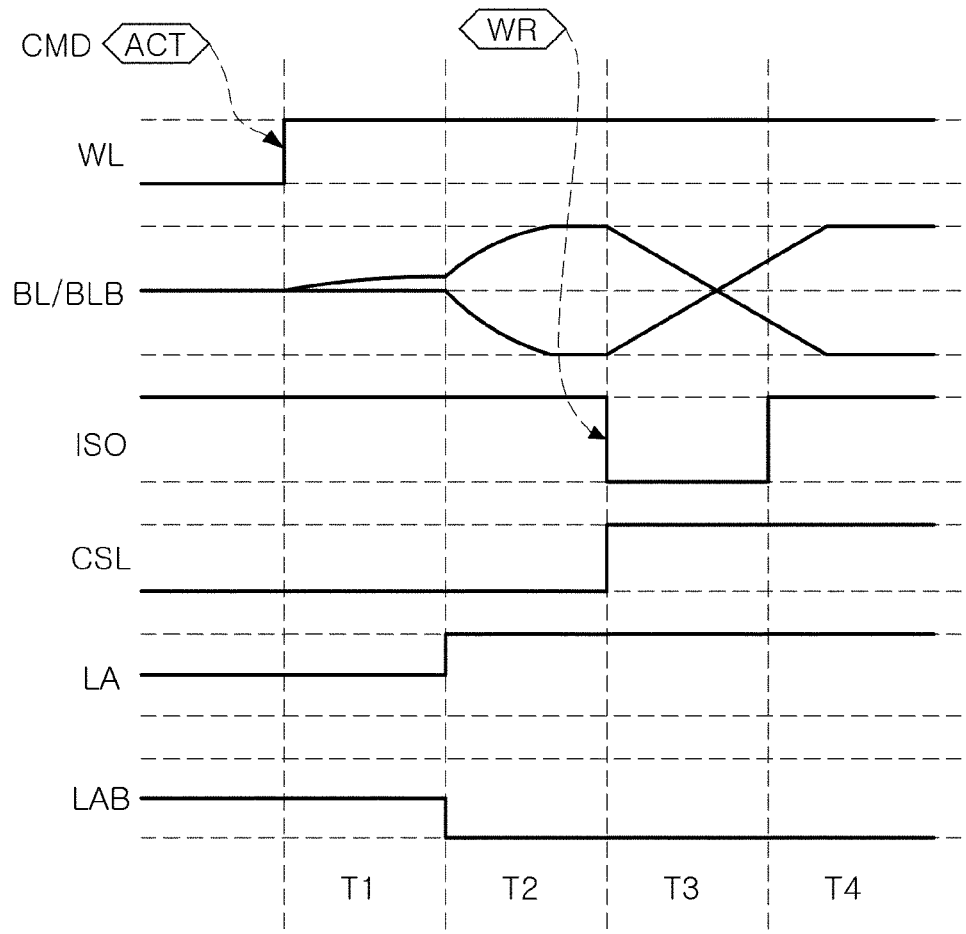
FIG. 7 is a diagram illustrating of operation timings of the semiconductor memory device illustrated in FIG. 6.

FIG. 7 is a diagram illustrating operation timings of the semiconductor memory device illustrated in FIG. 6, illustrating an example in which data difference from data stored in a memory cell may be stored in the memory cell. Referring to FIG. 7, the semiconductor memory device in the example embodiment may perform a charge sharing operation, a sensing operation, first writing driving operation, and a second writing driving operation consecutively in sequence, thereby performing a writing operation. A selected word line WL may be transited to a high level in response to an active command ACT.

In a time interval prior to a time interval T1, a semiconductor memory device may be in a pre-charged state.

In the time interval T1, a charge sharing operation may be performed.

In the time interval T1, a voltage of a selected word line WL may be a high level, a voltage of an isolation signal ISO may be a high level, a voltage of a column selection signal CSL may be a low level, and a first sensing driving voltage LA and a second sensing driving voltage LAB may be the pre-charge voltage level. The pre-charge voltage may be supplied to the first sensing driving voltage LA and second sensing driving voltage LAB by a pre-charge circuit (not shown). Accordingly, isolation transistors IS1 and IS2 of the first isolation portion 122-2 and the second isolation portion 123-2 may be in an on-state, and column selection transistors CS1 and CS2 of the first column selection portion 124-2 and the second column selection portion 125-2 may be in an off-state. An operation of the sense amplifier 121-2 may be not performed in the time interval T1. The selected word line WL may be transited to a high level in response to an active command ACT.

In the time interval T1, data (electric charge) stored in the memory cell may move to the bit line BL and the complementary bit line BLB and to the sensing bit line SABL and the complementary sensing bit line SABLB. Accordingly, charge may be shared between the memory cell and the bit line BL and the complementary bit line BLB and between the memory cell and the sensing bit line SABL and the complementary sensing bit line SABLB.

In a time interval T2, a sensing operation may be performed.

In the time interval T2, a voltage of the selected word line WL may be a high level, a voltage of the isolation signal ISO may be a high level, a voltage of the column selection signal CSL may be a low level, a voltage of the first sensing driving voltage LA may be the first internal voltage VINTA, and a voltage of the second sensing driving voltage LAB may be the second internal voltage VSS lower than the first internal voltage VINTA. Accordingly, the isolation transistors IS1 and IS2 of the first isolation portion 122-2 and the second isolation portion 123-2 may be in an on-state, and the column selection transistors CS1 and CS2 of the first column selection portion 124-2 and the second column selection portion 125-2 may be in an off-state. The sense amplifier 121-2 may perform a sensing and amplifying operation in the time interval T2.

Accordingly, in the time interval T2, a voltage difference between the bit line BL and the complementary bit line BLB may be amplified in accordance with data stored in the memory cell.

In a time interval T3, first writing driving operation may be performed.

In the time interval T3, a voltage of the selected word line WL may be a high level, a voltage of the isolation signal ISO may be a low level, a voltage of the column selection signal CSL may be a high level, the first sensing driving voltage LA may be the first internal voltage VINTA, and the second sensing driving voltage LAB may be the second internal voltage VSS lower than the first internal voltage VINTA. Accordingly, the isolation transistors IS1 and IS2 of the first isolation portion 122-2 and the second isolation portion 123-2 may be in an off-state, and the column selection transistors CS1 and CS2 of the first column selection portion 124-2 and the second column selection portion 125-2 may in an on-state. The sense amplifier 121-2 may perform a sensing and amplifying operation in the time interval T3.

In the time interval T3, data transmitted to a data input and output line IO and a complementary data input and output line IOB through the writing driver 210 (in FIG. 2) may be transmitted to the bit line BL and the complementary bit line BLB via the column selection transistors CS1 and CS2 of the first column selection portion 124-2 and the second column selection portion 125-2. In this case, the bit line BL and the complementary bit line BLB may be disconnected from the sense amplifier 121-2 by being disconnected from the sensing bit line SABL and the complementary sensing bit line SABLB connected to the sense amplifier 121-2. Thus, even when data to be stored in the memory cell is different from data already stored in the memory cell, an operation of the writing driver 210 (in FIG. 2) may not contend with an operation of the sense amplifier 121-2, or a time during which the operations contend with each other may be reduced at least. Accordingly, states of the bit line BL and the complementary bit line BLB may be swiftly transited to difference states, and a speed of a writing operation may increase.

In a time interval T4, a second writing driving operation may be performed.

In the time interval T4, a voltage of a selected word line WL may be a high level, a voltage of the isolation signal ISO may be a high level, a voltage of the column selection signal CSL may be a high level, the first sensing driving voltage LA may be the first internal voltage VINTA, and the second sensing driving voltage LAB may be the second internal voltage VSS lower than the first internal voltage VINTA. Accordingly, the isolation transistors IS1 and IS2 of the first isolation portion 122-2 and the second isolation portion 123-2 may be in an on-state, and the column selection transistors CS1 and CS2 of the first column selection portion 124-2 and the second column selection portion 125-2 may in an on-state. The sense amplifier 121-1 may perform a sensing and amplifying operation in the time interval T4.

In the time interval T4, a voltage difference between the bit line BL and the complementary bit line BLB may be sensed and amplified by an operation of the sense amplifier 121-2. Also, data may be stored in the memory cell in accordance with a result of the operation of the sense amplifier 121-2.

Figure 8:
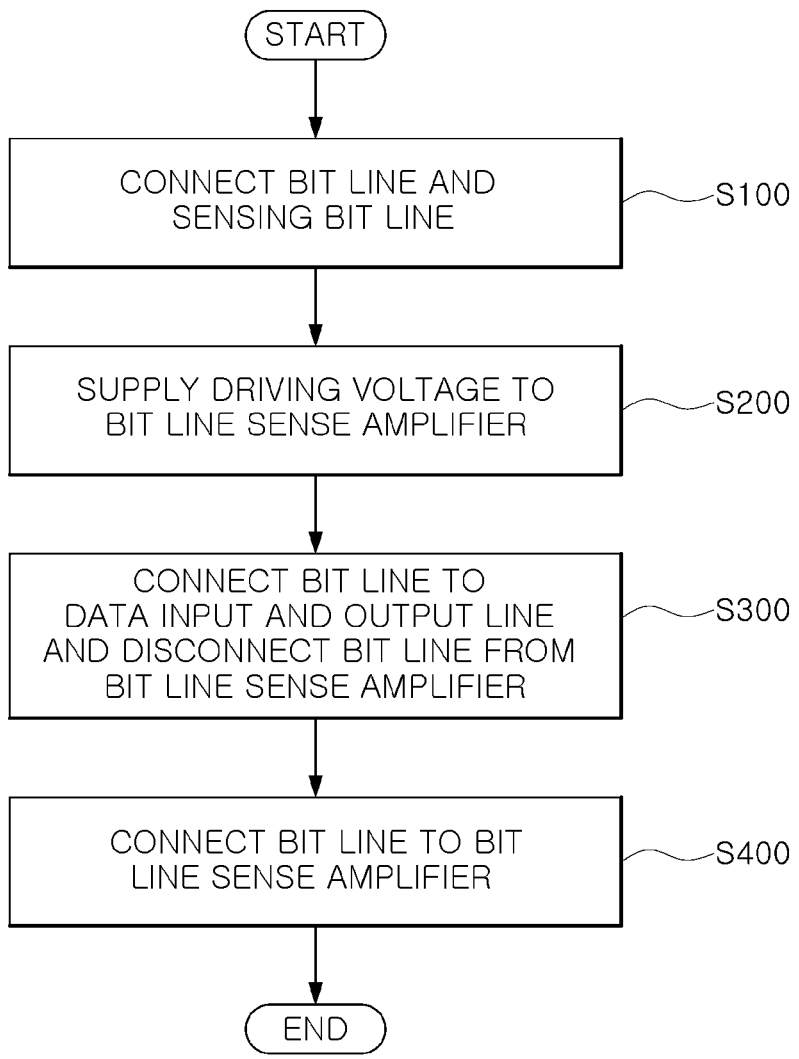
FIG. 8 is a flowchart illustrating a writing method of a semiconductor memory device according to an example embodiment of the present inventive concept.

FIG. 8 is a flowchart illustrating a writing method of a semiconductor memory device according to an example embodiment. The operations illustrated in FIG. 6 may be performed by the command decoder 510, the control logic 520, and the column decoder 430 illustrated in FIG. 1, and switches (e.g., the first and second isolation portions 122, 122-1, 122-2, 123, 123-1, and 123-2, the first and second column selection portions 124, 124-1, 124-2, 125, 125-1, and 125-2, and the first and second offset removing portions 126-1 and 127-1 illustrated in FIGS. 3, 4, and 6) controlled by the above-mentioned elements.

As described above, in the semiconductor memory device, a pair of data input and output lines (a data input and output line IO and a complementary data input and output line IOB) may be connected to a pair of bit lines (a bit line BL and a complementary bit line BLB) through a column selection portion (the column selection portions 124 and 125 in FIG. 3, the column selection portions 124-1 and 125-1 in FIG. 4, and the column selection portions 124-2 and 125-2 in FIG. 6), a sense amplifier (the sense amplifier 121 in FIG. 3, the sense amplifier 121-1 of the first bit line sense amplifier S/A-1 in FIG. 4, and the sense amplifier 121-2 of the second bit line sense amplifier S/A-2 in FIG. 6) may be connected to a pair of sensing bit lines (the sensing bit line SABL and the complementary sensing bit line SABLB).

The pair of bit lines may be connected to the pair of sensing bit lines (operation S100). The pair of bit lines may be connected to the pair of sensing bit lines by the first and second isolation portions. The first and second isolation portions may be controlled by a command decoder and a control logic.

A sensing driving voltage (a first sensing driving voltage LA, a first internal voltage VINTA, and a second sensing driving voltage LAB, a second internal voltage VSS lower than the first internal voltage VINTA) may be supplied to the sense amplifier to activate the sense amplifier (operation S200). The sensing driving voltage may be supplied to the sense amplifier in response to a control signal output from the command decoder and the control logic. To this end, the semiconductor memory device in the example embodiment may further include a switch connected between a terminal to which the first internal voltage VINTA is applied and the first sensing driving voltage line LA and operating in response to the control signal, and a switch connected between a terminal to which the second internal voltage VSS is applied and the second sensing driving voltage line LAB and operating in response to the control signal. The sense amplifier may sense and amplify a voltage difference between the pair of sensing bit lines, and accordingly, a voltage difference between the pair of bit lines may also be amplified.

The pair of bit lines may be connected to the pair of data input and output lines, and the pair of bit lines may be disconnected from the sense amplifier during a certain period of time (operation S300). The pair of bit lines may be connected to the pair of data input and output lines by a first column selection portion and a second column selection portion. The first column selection portion and the second column selection portion may be controlled by a column decoder. In the operation S300, by disconnecting the pair of bit lines from the pair of sensing bit lines, the pair of bit lines may be disconnected from the sense amplifier. The pair of bit lines may be disconnected from the pair of sensing bit lines by the first and second isolation portions. Also, even when data different from data stored in a memory cell is written in the memory cell, a state of the pair of bit lines may be swiftly transited to a different state as the pair of bit lines is disconnected from the sense amplifier of the bit line sense amplifier.

The pair of bit lines may be connected to the sense amplifier of the bit line sense amplifier (operation S400). In the operation S400, by connecting the pair of bit lines to the pair of sensing bit lines, the pair of bit lines may be connected to the sense amplifier. Also, similarly to the operation S100, the pair of bit lines may be connected to the pair of sensing bit lines by the first and second isolation portions. Data may be written in the memory cell in accordance with operation of the sense amplifier.

Figure 9:
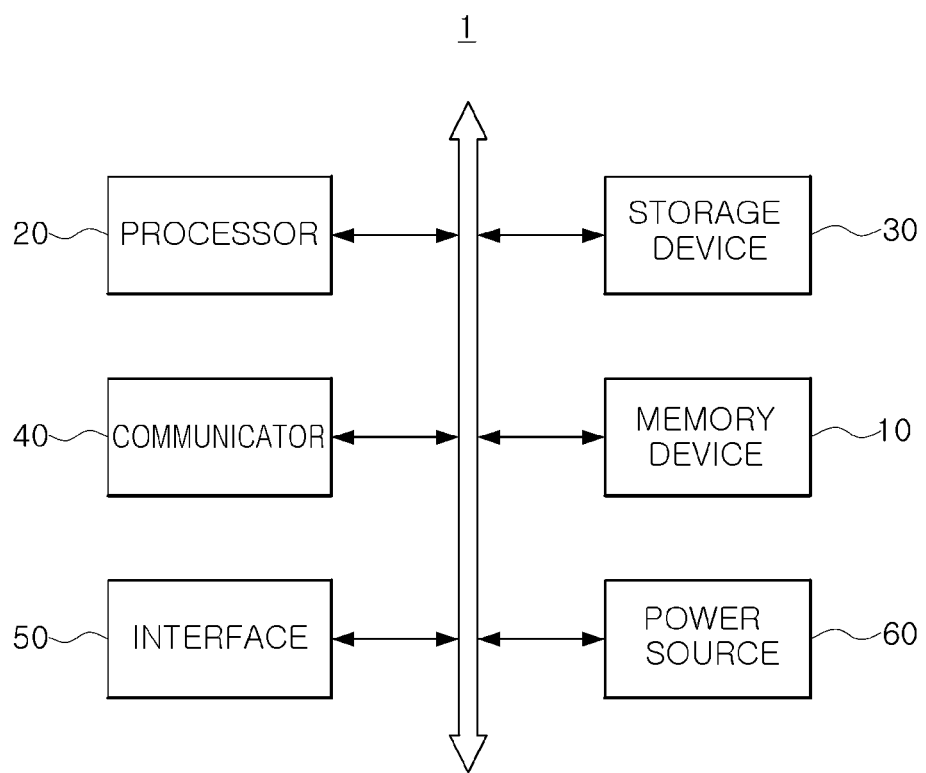
FIG. 9 is a diagram illustrating a computing system including a semiconductor memory device according to an example embodiment of the present inventive concept.

FIG. 9 is a diagram illustrating a computing system including a semiconductor memory device according to an example embodiment. A computing system 1 may include a semiconductor memory device 10, a processor 20, a storage device 30, a communicator 40, an interface 50, and a power source 60.

The semiconductor memory device 10 may store data processed by the processor 20, or may operate as a working memory. The semiconductor memory device 10 may be implemented as the semiconductor memory device described with reference to FIGS. 1 to 7 in the aforementioned example embodiments.

The processor 20 may execute various programs.

The storage device 30 may be implemented by a non-volatile memory device, and may store various files required for booting and operating the computing system.

The communicator 40 may perform wireless communication or wired communication with an external device.

The interface 50 may include one or more input devices such as a keyboard and a touch screen and/or one or more output devices such as a display device.

The power source 60 may supply an operational voltage to the computing system 1.

According to the aforementioned example embodiments, by reducing the time for which data is written, an operational speed of the semiconductor memory device may improve.

While the example embodiments have been shown and described above, it will be apparent to those skilled in the art that modifications and variations could be made without departing from the scope of the present invention as defined by the appended claims.

What is claimed is:

1. A semiconductor memory device, comprising:
a plurality of memory cells connected to a pair of bit lines;
a column selection circuit; and
a sense amplifier,
wherein the semiconductor memory device is configured such that when the semiconductor memory device is in a data writing operation:
the column selection circuit electrically connects a pair of data input and output lines to the pair of bit lines during a first time interval and a second time interval, consecutively arranged, and
the sense amplifier electrically disconnects from the pair of bit lines in response to a write command during the first time interval, and senses and amplifies a voltage difference between the pair of bit lines during the second time interval.

2. The semiconductor memory device of claim 1, wherein the column selection circuit electrically connects the pair of data input and output lines to the pair of bit lines at a time point at which the first time interval starts.

3. The semiconductor memory device of claim 1, wherein the column selection circuit electrically disconnects the pair of data input and output lines from the pair of bit lines during a third time interval prior to the first time interval, and
wherein the sense amplifier senses and amplifies a voltage difference between the pair of bit lines during the third time interval.

4. The semiconductor memory device of claim 1, further comprising:
an isolation circuit,
wherein the semiconductor memory device is configured such that when the semiconductor memory device is in the data writing operation, the isolation circuit electrically disconnects a pair of sensing bit lines connected to the sense amplifier from the pair of bit lines during the first time interval, and electrically connects the pair of sensing bit lines to the pair of bit lines during the second time interval.

5. The semiconductor memory device of claim 4, wherein further configured such that during a third time interval prior to the first time interval:
the isolation circuit electrically connects the pair of sensing bit lines to the pair of bit lines,
the column selection circuit electrically disconnects the pair of data input and output lines from the pair of bit lines, and
the sense amplifier senses and amplifies a voltage difference between the pair of sensing bit lines.

6. The semiconductor memory device of claim 5, wherein the pair of bit lines includes a bit line and a complementary bit line,
wherein the pair of sensing bit lines includes a sensing bit line and a complementary sensing bit line,
wherein the isolation circuit includes a first isolation circuit and a second isolation circuit, and
wherein the semiconductor memory device is configured such that in response to an isolation signal:
the first isolation circuit electrically connects or disconnects the bit line to or from the sensing bit line, and
the second isolation circuit electrically connects or disconnects the complementary bit line to or from the complementary sensing bit line.

7. The semiconductor memory device of claim 6, further comprising:
an offset removing circuit,
wherein the semiconductor memory device is configured such that:
during the first, second and third time intervals, the offset removing circuit electrically disconnects the bit line and the complementary bit line from the complementary sensing bit line and the sensing bit line, respectively, and
during a fourth time interval prior to the third time interval, the bit line and the complementary bit line are electrically connected to the complementary sensing bit line and the complementary sensing bit line, respectively.

8. The semiconductor memory device of claim 7, wherein the semiconductor memory device is configured such that during the fourth time interval:
the column selection circuit electrically disconnects the pair of bit lines from the pair of data input and output lines,
the isolation circuit electrically disconnects the pair of bit lines from the pair of sensing bit lines, and
the sense amplifier senses and amplifies a voltage difference between the pair of sensing bit lines.

9. A semiconductor memory device, comprising:
a first memory cell connected to a bit line;
a second memory cell connected to a complementary bit line;
a first isolation transistor connected between the bit line and a sensing bit line, and having a gate configured to receive an isolation signal;
a second isolation transistor connected between the complementary bit line and a complementary sensing bit line, and having a gate configured to receive an isolation signal;
a first column selection transistor connected between the bit line and a data input and output signal line, and having a gate configured to receive a column selection signal;
a second column selection transistor connected between the complementary bit line and a complementary data input and output signal line, and having a gate configured to receive the column selection signal; and
a sense amplifier connected between the sensing bit line and the complementary sensing bit line,
wherein the semiconductor memory device is configured such that when the semiconductor memory device is in a data writing operation:
the first column selection transistor and the second column selection transistor are turned on during a first time interval and a second time interval, consecutively arranged,
the first isolation transistor and the second isolation transistor are turned off during the first time interval and are turned on during the second time interval, and
the sense amplifier senses and amplifies a voltage difference between the sensing bit line and the complementary sensing bit line during the first time interval and the second time interval.

10. The semiconductor memory device of claim 9, wherein further configured such that in response to the isolation signal, the first column selection transistor and the second column selection transistor are turned on at a time point at which the first time interval starts.

11. The semiconductor memory device of claim 9, wherein further configured such that during a third time interval prior to the first time interval:
the first column selection transistor and the second column selection transistor are turned off,
the first isolation transistor and the second isolation transistor are turned on, and
the sense amplifier senses and amplifies a voltage difference between the sensing bit line and the complementary sensing bit line.

12. The semiconductor memory device of claim 9, further comprising:
a first offset removing transistor connected between the bit line and the complementary sensing bit line, and having a gate configured to receive an offset control signal; and
a second offset removing transistor connected between the complementary bit line and the sensing bit line, and having a gate configured to receive the offset control signal,
wherein the semiconductor memory device is configured such that the first offset removing transistor and the second offset removing transistor are turned off during the first time interval and the second time interval.

13. The semiconductor memory device of claim 12, wherein further configured such that during a third time interval prior to the first time interval:
the first column selection transistor and the second column selection transistor are turned off,
the first isolation transistor and the second isolation transistor are turned on,
the first offset removing transistor and the second offset removing transistor are turned off during the third time interval, and
the sense amplifier senses and amplifies a voltage difference between the sensing bit line and the complementary sensing bit line.

14. The semiconductor memory device of claim 13, wherein the semiconductor memory device is configured such that during a fourth time interval prior to the third time interval:
the first column selection transistor and the second column selection transistor are turned off,
the first isolation transistor and the second isolation transistor are turned off,
the first offset removing transistor and the second offset removing transistor are turned on, and
the sense amplifier senses and amplifies a voltage difference between the sensing bit line and the complementary sensing bit line.

15. An operating method of a semiconductor memory device including a sense amplifier sensing and amplifying a voltage difference between a pair of bit lines, the method comprising:
performing a first write driving operation; and
performing a second write driving operation after performing the first write driving operation,
wherein the first write driving operation includes electrically connecting a pair of data input and output lines to a pair of bit lines, transmitting data to the pair of bit lines from the pair of data input and output lines, and electrically disconnecting the pair of bit lines from the sense amplifier, and
wherein the second write driving operation includes electrically connecting the pair of bit lines to the sense amplifier, and by the sense amplifier, sensing and amplifying a voltage difference between the pair of bit lines.

16. The method of claim 15, wherein the sense amplifier is connected to a pair of sensing bit lines, and
wherein the first writing driving operation further includes electrically disconnecting the pair of bit lines from the sense amplifier by electrically disconnecting the pair of bit lines from the pair of sensing bit lines.

17. The method of claim 15, wherein the electrically disconnecting of the pair of bit lines from the sense amplifier is performed while electrically connecting of the pair of data input and output lines to the pair of bit lines, and sensing and amplifying a voltage difference between the pair of bit lines.

18. The method of claim 15, further comprising:
performing a sensing operation before the first writing driving operation,
wherein the sensing operation includes:
electrically disconnecting the pair of data input and output lines from the pair of bit lines, and
sensing and amplifying a voltage difference between the pair of bit lines by the sense amplifier.

19. The method of claim 18, further comprising:
performing a charge sharing operation before the sensing operation,
wherein the charge sharing operation includes:
electrically disconnecting the pair of data input and output lines from the pair of bit lines, and electrically connecting the pair of bit lines to a pair of sensing bit lines connected to the sense amplifier.

20. The method of claim 19, wherein the pair of bit lines includes a bit line and a complementary bit line, wherein the pair of sensing bit lines includes a sensing bit line and a complementary sensing bit line, wherein the method further comprises an offset removing operation, and wherein the offset removing operation includes:

electrically connecting the bit line and the complementary bit line to the complementary sensing bit line and the sensing bit line, respectively, and sensing and amplifying a voltage difference between the pair of sensing bit lines by the sense amplifier.

\* \* \* \* \*